(12) United States Patent
Motomura

(10) Patent No.: US 9,643,303 B2
(45) Date of Patent: May 9, 2017

(54) JIG FOR SUPPLYING SEMI-CIRCULAR MEMBER

(71) Applicant: HONDA MOTOR CO., LTD., Tokyo (JP)

(72) Inventor: Takefumi Motomura, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/384,213

(22) PCT Filed: Feb. 26, 2013

(86) PCT No.: PCT/JP2013/054901
§ 371 (c)(1),
(2) Date: Sep. 10, 2014

(87) PCT Pub. No.: WO2013/136966
PCT Pub. Date: Sep. 19, 2013

(65) Prior Publication Data
US 2015/0128396 A1    May 14, 2015

(30) Foreign Application Priority Data
Mar. 12, 2012    (JP) .................................. 2012-054109

(51) Int. Cl.
*B25B 27/06* (2006.01)
*H01L 21/68* (2006.01)
(Continued)

(52) U.S. Cl.
CPC .............. *B25B 27/06* (2013.01); *B23P 19/00* (2013.01); *F16C 9/02* (2013.01); *H01L 21/68* (2013.01);
(Continued)

(58) Field of Classification Search
CPC .......... B25B 27/06; B25B 27/00; B25B 27/14; F16C 9/02; H01L 21/68; H01L 21/681
See application file for complete search history.

(56) References Cited

U.S. PATENT DOCUMENTS 3,766,046 A * 10/1973 Flint ................. H01L 21/67326
                                                        204/297.08
4,662,811 A *  5/1987 Hayden .................. H01L 21/68
                                                        198/394
(Continued)

FOREIGN PATENT DOCUMENTS

EP      1628266 A2 *  2/2006  ............. G07D 3/125
JP      06-254728        9/1994
(Continued)

OTHER PUBLICATIONS

International Search Report, Date of Mailing: Apr. 9, 2013 (Apr. 9, 2013).

*Primary Examiner* — Monica Carter
*Assistant Examiner* — Seahee Yoon
(74) *Attorney, Agent, or Firm* — Rankin, Hill & Clark LLP

(57) ABSTRACT

A protruding portion is formed on a rear side of a side plate, namely a side surface forming guide passage. The protruding portion is intended to prevent a thrust metal from being put to the guide passage with the left and right ends being in the wrong position. Accordingly, a height of the protruding portion is smaller than a depth of the oil ditch of the thrust metal, the width of the protruding portion is smaller than the width of the oil ditch. Also, regarding to the formation position of the protruding portion, when the thrust metal is truly set to guide passage, the center of the protruding portion approximately accords with the center of the oil ditch of the thrust metal.

6 Claims, 4 Drawing Sheets

(51) Int. Cl.
*B23P 19/00* (2006.01)
*F16C 9/02* (2006.01)
(52) U.S. Cl.
CPC ....... *H01L 21/681* (2013.01); *Y10T 29/53913* (2015.01)

(56) References Cited

U.S. PATENT DOCUMENTS

| | | | | |
|---|---|---|---|---|
| 5,183,378 A | * | 2/1993 | Asano | H01L 21/68 414/416.08 |
| 5,472,099 A | * | 12/1995 | Terashima | H01L 21/6732 118/500 |
| 6,309,166 B1 | * | 10/2001 | Kato | H01L 21/67005 414/222.1 |

FOREIGN PATENT DOCUMENTS

| | | |
|---|---|---|
| JP | 07-009286 | 1/1995 |
| JP | 10-118856 | 5/1998 |
| JP | 11-201185 | 7/1999 |
| JP | 2002-039154 | 2/2002 |

\* cited by examiner

JIG FOR SUPPLYING SEMI-CIRCULAR MEMBER

FIELD OF THE INVENTION

The present invention relates to a jig for supplying a semi-circular member such as a thrust metal (thrust bearing) or division washer.

BACKGROUND ART

As shown in FIG. 7, the right and left sides of a journal portion 100 of a crank shaft are provided with a counterweight 101,102, this journal portion 100 is put in to a bulk portion 103 of a cylinder block and a bearing cap, and a ditch is formed on a plane opposed to the counterweight of the bulk portion 103 (bearing cap), a thrust metal 104 (thrust bearing) is inserted into this ditch, the thrust metal 104 receives axial power.

As shown in FIG. 8 (a), (b), the shape of the thrust metal 104 is semi-circular, and an oil ditch 105 is formed on the outside surface opposed to the counterweight.

A device which installs the above described thrust metal into the journal portion as disclosed in Patent Document 1 is known.

In this device, the thrust metal contained in a magazine is taken out in one piece using a slider, two pieces of thrust metal are installed into a transit head in parallel so that the bearing surface of the thrust metal faces outwards, subsequently, the thrust metal on either side of an imposition head is transferred without changing the direction, the thrust metal is aligned sequentially in a thrust metal ditch by the insertion of the assembling head and the movement in the direction of approach, the ditch is provided on either side of a bearing portion of a cylinder block in which a crank shaft is installed, the thrust metal held by an imposition head is given a rotary motion, and the thrust metal is made to come into the thrust metal ditch.

Also, Patent Document 2 discloses that a ditch, in which a semi-circular thrust metal is mounted, is formed on a bulk portion of a cylinder block, a tang is provided at one end of the thrust metal engaged with the ditch and prevents the thrust metal from interfering with the crank shaft.

PRIOR ART

Patent Document

[Patent Document 1] Japanese Patent Laid-Open No. H10-118856
[Patent Document 2] Japanese Patent Laid-Open No. 2002-39154

DISCLOSURE OF INVENTION

Problems Solved by the Invention

An oil ditch is formed on a bearing surface (opposed surface to a counterweight) of the thrust metal, and this oil ditch has to be mounted so as to face to the outside.

In the case of Patent Document 1, a mistake in mounting does not happen since the whole operation is automatically performed, but there is a problem in that the overall system becomes large-scale.

On the other hand, in the case of manual labor as described in Patent Document 2, it is simple and easy but the above described setting/positioning error might happen.

As well as the thrust metal, the direction of setting of some division washers is also decided, so, a jig which does not cause a setting error is expected.

Means For Solving the Problems

To solve the above described problem, a jig for supplying a semi-circular member of the present invention is characterized, the jig is provided with a guide passage which drops a semi-circular member into a storing groove formed in a receiver portion, the guide passage is provided with a protruding portion, the protruding portion allows the semi-circular member to go into the groove when the semi-circular member is set in the correct direction.

The object of the present invention is the setting/positioning of a semi-circular member, expected to be a thrust metal or division washer which has a recess/recesses, such as oil ditches, formed on the surface of one side. It is required that the side surface on which these recesses, such as oil ditches, are formed always faces in one direction.

Also, it is preferable to form an inclined surface which causes one end of the falling semi-circular member to jump and raises it diagonally, when the semi-circular member jumps and raises diagonally due to the inclined surface being formed in this way, the occurrence of a malfunction, such as the semi-circular member stopping in a position stepped over an axis, can be prevented.

When the angle of the ramp is assumed at between 15-60 degrees, a setting error can be prevented with a probability of 90% or more, in particular, when an angle of inclination of 45 degrees is assumed, the setting error prevention was 100%.

Also as a structure of the jig, it is expected/usual to attach a side plate to the right and left sides of the main body, the guide passage is formed between the main body and the side plate, and the protruding portion is formed in the inboard surface of the side plate.

Alternatively, a top plate is attached to the main body, the aperture of the guide passage and the protruding portion are formed to this top plate.

Effects of the Invention

According to the jig for supplying a semi-circular member of the present invention, the semi-circular member can be supplied into a predetermined storing ditch without getting the direction of the thrust metal wrong, also without using a large-scale and complicated device.

Also, in providing the inclined surface on the bottom end of the guide passage, the falling semi-circular member jumps and raises the angularly of one end (not 90 degrees), as a result, the semi-circular member is easily put into the storing ditch.

BEST MODE FOR CARRYING OUT THE INVENTION

An embodiment of the present invention is explained below 1 based on an attached drawing.

Figure 1:
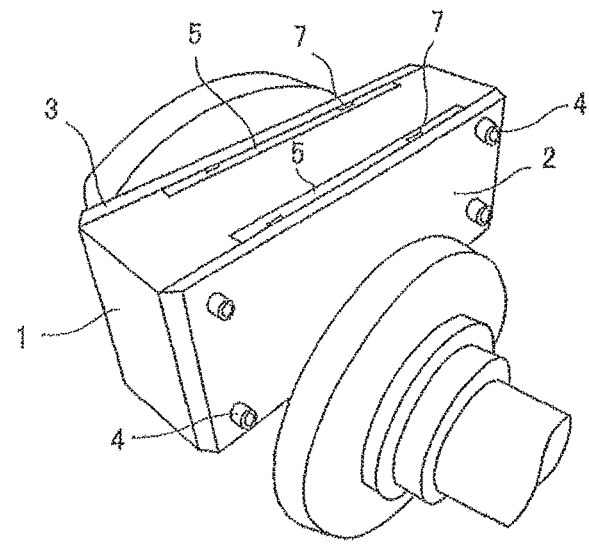
FIG. 1 A perspective illustration which shows the usage state of the jig for supplying the semi-circular member of the present invention.
Figure 2:
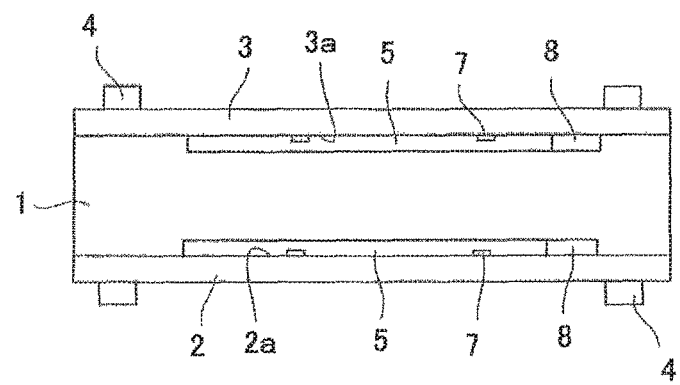
FIG. 2 A plane view of the jig for supplying the semi-circular member.
Figure 3:
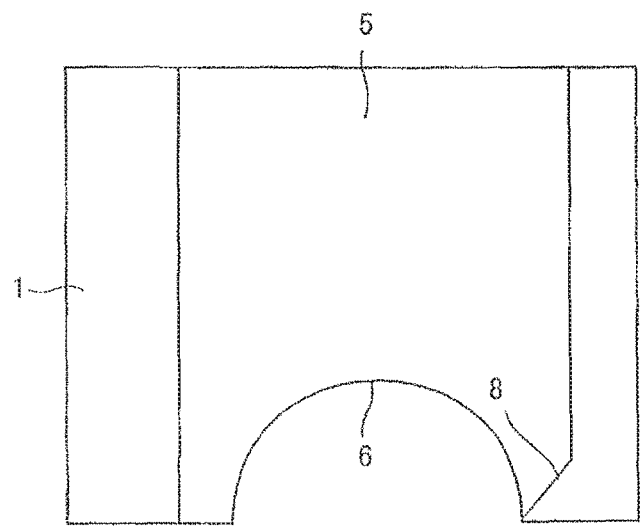
FIG. 3 A front view in which a side plate of the jig for supplying the semi-circular member has been removed.

As shown in FIG. 1-3, a main body 1 of a jig for supplying a semi-circular member is provided with a right and left plate 2, 3 using screws, the right and left side plate 2, 3 are attached (releasably) so as to be removable.

A recess is formed on the side surface of the main body 1 in a top to bottom direction, a guide passage 5 is formed between the side plate and the side surface of the main body 1 by blocking up the recess with side plate 2, 3, the guide passage 5 penetrates in a top to bottom direction.

The bottom end of guide passage 5 is formed as a semicircular recess 6 to step over the journal portion of the crank shaft.

Also, a protruding portion 7 is formed on the rear side 2a, 3a of the side plate 2, 3 namely a side surface forming guide passage 5.

The protruding portion 7 is intended to prevent the thrust metal from being put to the guide passage 5 with the left and right ends being in the wrong position. Accordingly, the height of the protruding portion 7 is smaller than the depth of the oil ditch of the thrust metal, the width of the protruding portion 7 is smaller than the width of the oil ditch.

Also, regarding to the formation position of the protruding portion 7, when the thrust metal is truly set to guide passage 5, the center of the protruding portion 7 approximately accords with the center of the oil ditch of the thrust metal.

And, a projection is formed on one lower end of the guide passage 5, the projection has an inclined surface 8 and it protrudes inside of the guide passage 5.

Figure 4:
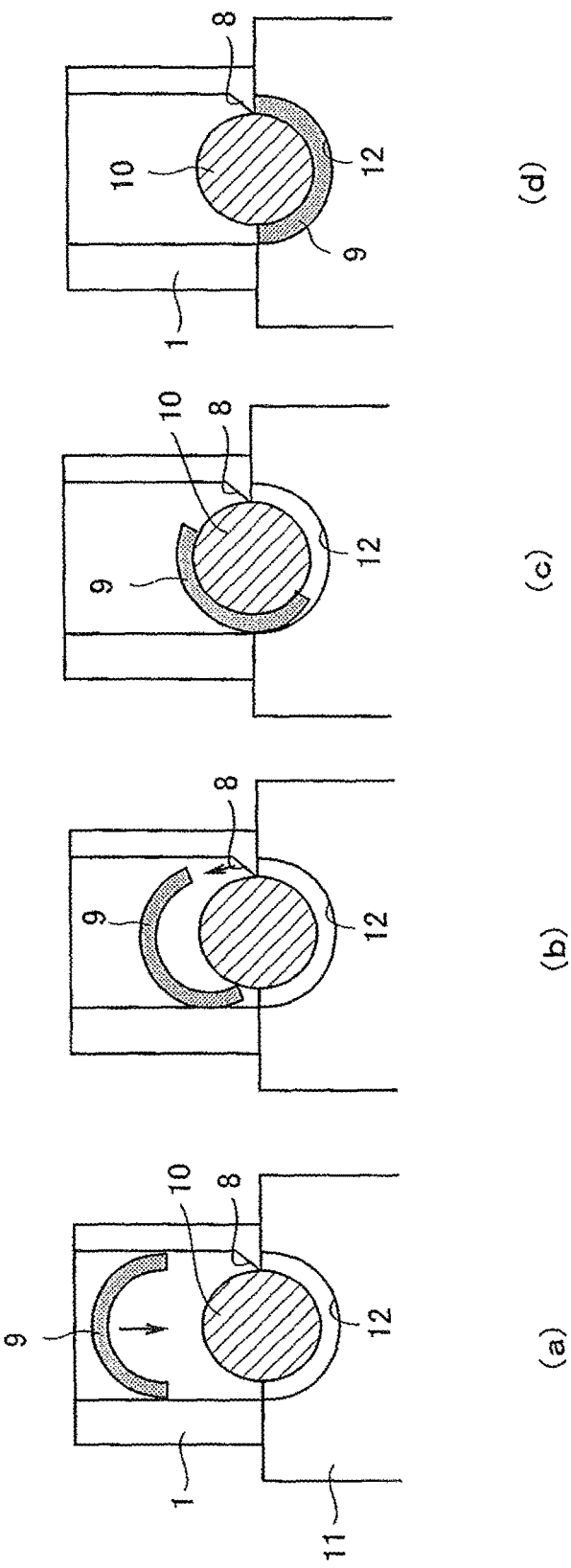
FIG. 4 (a)-(d) are figures explaining the process before the thrust metal has been mounted.

FIG. 4 (a)-(d) is a figure which explains the process before the thrust metal has been mounted. Firstly, as shown in (a), the thrust metal 9 is set to fall into the guide passage 5.

Then as shown in (b), at the bottom of the fall, one end of the thrust metal 9 collides with the inclined surface 8 and that end of the thrust metal 9 jumps up angularly.

By this jumping up, the thrust metal 9 does not lock in a position stepping over the journal portion 10.

Figure 5:
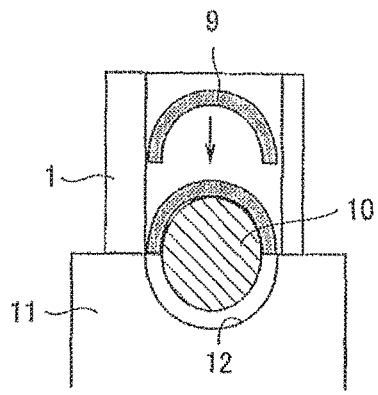
FIG. 5 A figure explaining the inconvenience caused in the case where he guide passage does not have a protruding portion.

However, when there is no inclined surface 8, as shown in FIG. 5, the thrust metal 9 rests stepped over the journal portion 10 and the thrust metal 9 cannot get into the storing ditch 12 formed to the journal tray portion 11.

Subsequently, as shown in (c), the thrust metal 9 is smoothly directed into the end in the storing ditch 12 formed on the journal tray portion 11 and, as shown in (d), the end of the thrust metal 9 comes into contact with the base of the inclined projection 8 and stops.

Figure 6:
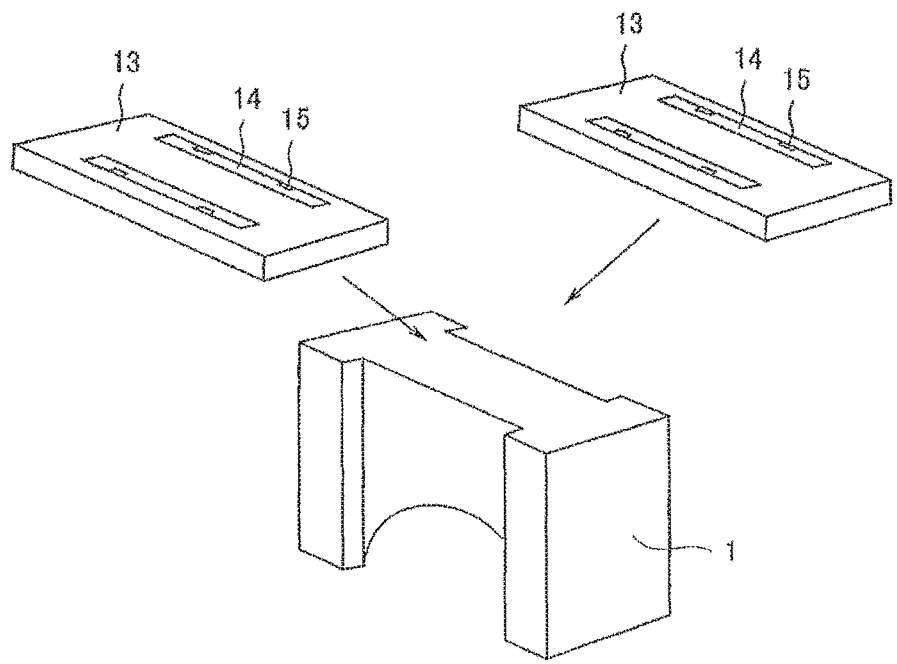
FIG. 6 A perspective illustration of the other embodiment.
Figure 7:
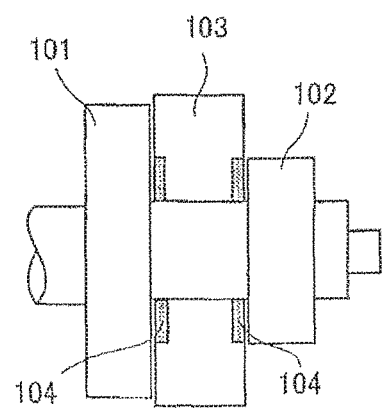
FIG. 7 A figure showing the journal portion where the thrust metal is mounted.
Figure 8:
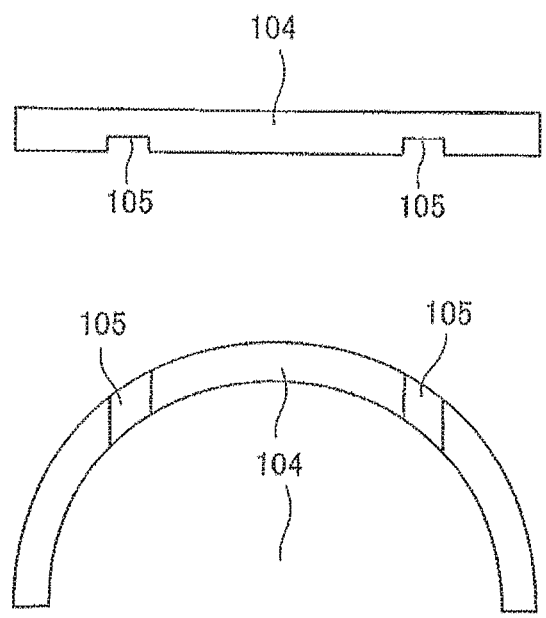
FIG. 8 (a) A plane view of the thrust metal, (b) A front view of the thrust metal.

FIG. 6 shows the other embodiment, in this embodiment, the main body 1 is provided with a removable top plate 13 on the top surface (releasably.)

An aperture 14 for guide passage 5 and a protruding portion 15 corresponding to the protruding portion 7 are formed to the top plate 13.

In this embodiment, a plurality of top plates are prepared having apertures 14 and protruding portions 7 of different sizes and different shapes, and the top plate is changed depending on the model.

INDUSTRIAL APPLICABILITY

The jig of the present invention can be applied not only to the manual installation of the thrust metal but also to the automatic mounting apparatus of the thrust metal.

EXPLANATIONS OF THE LETTERS AND NUMERALS

1 . . . main body of the jig, 2,3 . . . side plate, 4 . . . screw, 5 . . . guide passage, 6 . . . semicircular recess, 7 . . . protruding portion, 8 . . . inclined surface, 9 . . . thrust metal, 10 . . . journal portion, 11 . . . journal tray, portion, 12 . . . storing ditch, 13 . . . top plate, 14 . . . aperture, 15 . . . protruding portion.

The invention claimed is:

1. A combination comprising: a semi-circular thrust metal and a jig for supplying the semi-circular thrust metal into a storing ditch of a crank shaft, the thrust metal having a groove that functions as an oil ditch on a one side surface, the jig comprising a guide passage configured to drop the thrust metal into the storing ditch, an inclined surface being formed on a bottom end of a right side or a left side of the guide passage, the inclined surface configured to cause the falling thrust metal to jump and be raised diagonally, and one side of an opposed face forming the guide passage is provided with a protruding portion, wherein the height of the protruding portion is smaller than the depth of the oil ditch formed in the thrust metal, and the width of the protruding portion is smaller than the width of the oil ditch.

2. The combination according to claim 1, wherein the jig is provided with a side plate in each side surface of a main body, the guide passage is formed between the main body and the side plate, and the protruding portion is formed in an inboard surface of the side plate.

3. The combination according to claim 1, wherein a top plate is attached to a top surface of the main body, and an aperture and the protruding portion of the guide passage are formed to the top plate.

4. The combination according to claim 2, wherein a side surface of the main body includes a recess, and the side plate covers the recess.

5. The combination of claim 1, wherein the bottom end of the guide passage is formed as a semicircular recess sized to fit over the crank shaft.

6. The combination according to claim 1, wherein the thrust metal forms in a flat on the other side surface, and the side surface on which a recess of the oil ditch is formed always faces in one direction.

* * * * *